(12) United States Patent
Hashimoto et al.

(10) Patent No.: US 9,647,206 B2
(45) Date of Patent: May 9, 2017

(54) METHOD FOR ETCHING LAYER TO BE ETCHED

(71) Applicant: TOKYO ELECTRON LIMITED, Tokyo (JP)

(72) Inventors: Mitsuru Hashimoto, Miyagi (JP); Takashi Sone, Miyagi (JP); Eiichi Nishimura, Miyagi (JP); Keiichi Shimoda, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/030,406

(22) PCT Filed: Sep. 19, 2014

(86) PCT No.: PCT/JP2014/074922
§ 371 (c)(1),
(2) Date: Apr. 19, 2016

(87) PCT Pub. No.: WO2015/076010
PCT Pub. Date: May 28, 2015

(65) Prior Publication Data
US 2016/0276582 A1 Sep. 22, 2016

(30) Foreign Application Priority Data

Nov. 20, 2013 (JP) .................................. 2013-239908
Aug. 25, 2014 (JP) .................................. 2014-170521

(51) Int. Cl.
*C03C 15/00* (2006.01)
*H01L 43/12* (2006.01)
(Continued)

(52) U.S. Cl.
CPC ............ *H01L 43/12* (2013.01); *G11C 11/161* (2013.01); *H01L 43/02* (2013.01); *H01L 43/08* (2013.01); *H01L 43/10* (2013.01)

(58) Field of Classification Search
CPC ........... H01L 21/3065; H01L 21/30655; H01L 43/10; H01L 43/12; C23F 4/00
(Continued)

(56) References Cited

U.S. PATENT DOCUMENTS 8,278,222 B2* 10/2012 Wu ...................... B08B 7/0035
438/706
2007/0197033 A1* 8/2007 Wilson .............. H01L 21/31105
438/689
(Continued)

FOREIGN PATENT DOCUMENTS

JP    H10-189537 A    7/1998
JP    2004-031466 A   1/2004
(Continued)

OTHER PUBLICATIONS

O. Almen et al. , "Collection and Sputtering Experiments with Noble Gas Ions", pp. 219-226; 1961.*
(Continued)

*Primary Examiner* — Binh X Tran
(74) *Attorney, Agent, or Firm* — Studebaker & Brackett PC

(57) ABSTRACT

Provided is a method for etching an etching target layer of a workpiece. The workpiece has a mask on the etching target layer. The etching target layer and the mask are formed from respective materials for which etching efficiency by a plasma of a rare gas having an atomic number greater than an atomic number of argon is higher than etching efficiency for the materials by a plasma of argon gas. The mask is formed from a material having a melting point higher than
(Continued)

that of the etching target layer. The method includes (a) exposing the workpiece to a plasma of a first process gas containing a first rare gas having an atomic number greater than the atomic number of argon, and (b) exposing the workpiece to a plasma of a second process gas containing a second rare gas having an atomic number less than the atomic number of argon.

4 Claims, 10 Drawing Sheets

(51) Int. Cl.
   *H01L 43/08* (2006.01)
   *G11C 11/16* (2006.01)
   *H01L 43/02* (2006.01)
   *H01L 43/10* (2006.01)

(58) Field of Classification Search
   USPC .............................................. 216/67, 72, 75
   See application file for complete search history.

(56) References Cited

U.S. PATENT DOCUMENTS

| | | | |
|---|---|---|---|
| 2010/0206841 A2* | 8/2010 | Ko | H01L 21/67069 216/37 |
| 2012/0276657 A1* | 11/2012 | Joubert | H01L 43/12 438/3 |

FOREIGN PATENT DOCUMENTS

| | | |
|---|---|---|
| JP | 2009-527899 A | 7/2009 |
| JP | 2012-204408 A | 10/2012 |
| WO | 2007/098233 A1 | 8/2007 |

OTHER PUBLICATIONS

Wikipedia, The free Encyclopedia, "Noble gas" via https://web.archive.org/web/20120204131414/https://en.wikipedia.org/wiki/Noble_gas ; 12 pages; 2012.*

International Search Report; PCT/JP2014/074922, mailed Nov. 25, 2014.

* cited by examiner

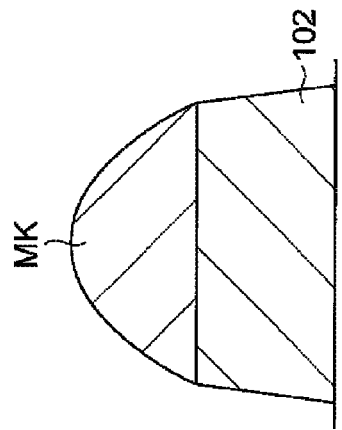
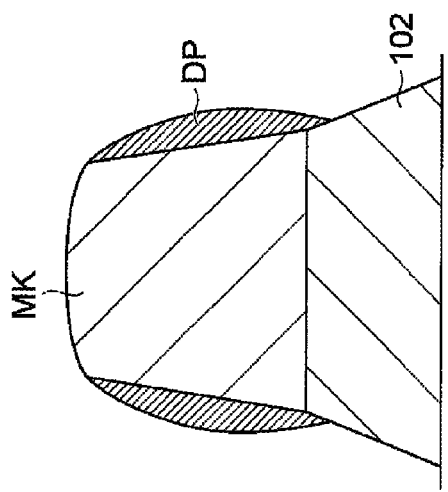
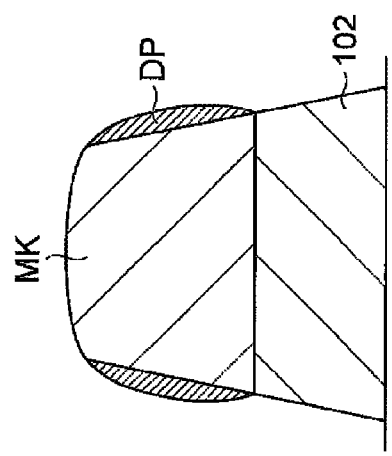

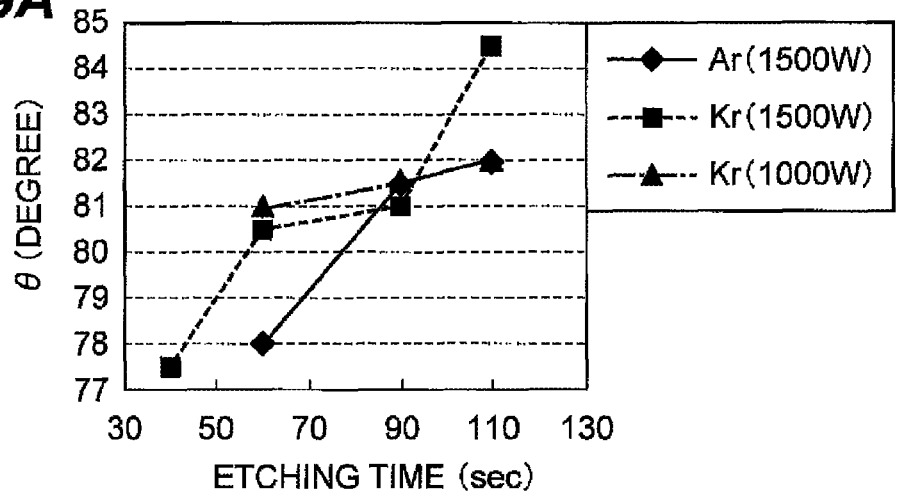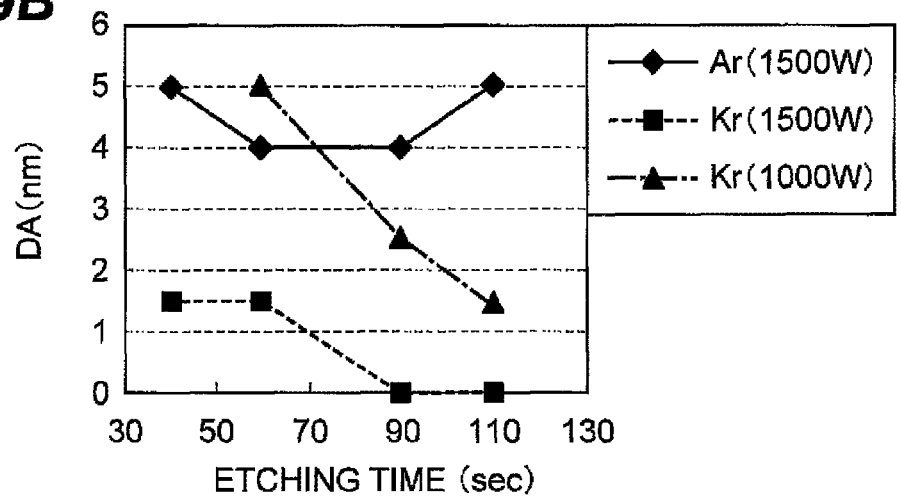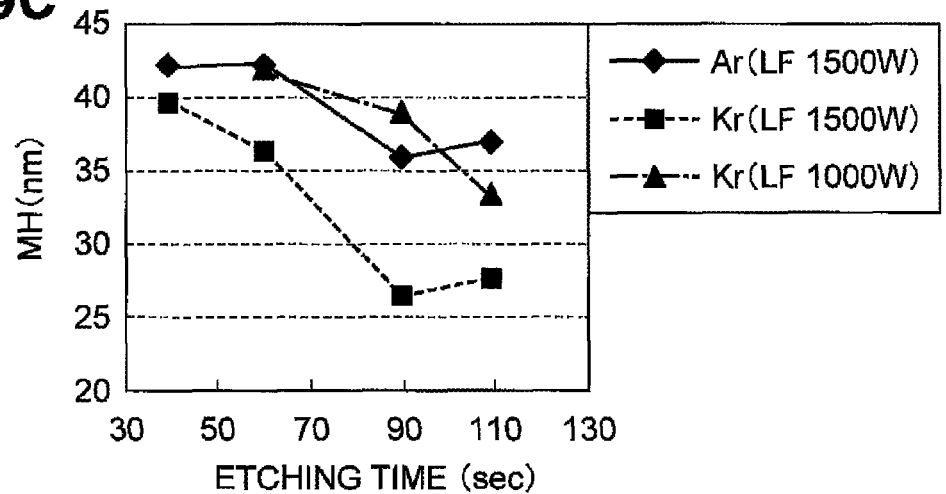

METHOD FOR ETCHING LAYER TO BE ETCHED

TECHNICAL FIELD

Embodiments of the present invention relates to a method for etching an etching target layer.

BACKGROUND ART

A magnetic random access memory (MRAM) element having a magnetic tunnel junction (MTJ) structure has attracted attention as one type of a memory element using a magnetoresistance effect element.

The MRAM element includes a multilayered film formed from a hard-to-etch material which contains a metal such as a ferromagnetic substance. In manufacturing of such an MRAM element, for example, a platinum manganese (PtMn) layer is etched by using a mask containing tantalum (Ta). In such etching, a halogen gas has been conventionally used, as disclosed in Japanese Patent Application Laid-Open Publication No. 2012-204408.

CITATION LIST

Patent Literature

[Patent Literature 1] Japanese Patent Application Laid-Open Publication No. 2012-204408

SUMMARY OF INVENTION

Technical Problem

However, in etching using plasma of a halogen gas, a reaction product is deposited on the side wall surface of a feature formed by the etching. The reaction product has a high melting point, and thus, is not easily vaporized. In a case where such a deposit is deposited on the side wall surface of the MTJ structure of the MRAM element and is not removed, the function of the MRAM element is impaired.

Therefore, in order to easily remove the reaction product in the following treatment step, the present inventors have made an attempt to use a process gas containing methane gas and argon gas as an etching gas.

In contrast, in etching used in the manufacturing of the MRAM element, there are three requirements, that is, (1) high verticality of a feature formed by the etching, (2) smallness of an amount of a reaction product deposited on a side wall surface of the feature, that is, the smallness of an amount of a deposit, and (3) high selection ratio of the etching of an etching target layer with respect to a mask.

In the etching in which a plasma of the process gas containing the methane gas and the argon gas is used, it is possible to improve the verticality and the selection ratio by increasing an amount of the methane gas. However, the amount of the deposit increases. In contrast, by reducing the amount of the methane gas, it is possible to reduce the amount of the deposit, but the verticality and the selection ratio deteriorates. Thus, the process gas containing the methane gas and the argon gas has a limit to simultaneously satisfy the three requirements.

Therefore, as in the manufacture of the MRAM element, it is necessary to satisfy the three requirements described above in the etching of the etching target layer containing a metal.

Solution to Problem

In one aspect, a method for etching an etching target layer of a workpiece is provided. The workpiece includes a mask on the etching target layer. The etching target layer and the mask are formed from respective materials for which etching efficiency by a plasma of a rare gas having an atomic number greater than an atomic number of argon is higher than etching efficiency for the materials by a plasma of argon gas. The mask is formed from a material having a melting point which is higher than a melting point of the etching target layer. The method includes a step (a) of exposing the workpiece to a plasma of a first process gas containing first rare gas having an atomic number greater than the atomic number of argon, and a step (b) of exposing the workpiece to a plasma of a second process gas containing a second rare gas having an atomic number less than the atomic number of argon. In one embodiment, the step (a) and the step (b) are alternately repeated.

The plasma of the rare gas having an atomic number greater than the atomic number of the argon, that is, the plasma of the first rare gas has high sputtering efficiency, that is, high etching efficiency for a material having a relatively large atomic number. Therefore, the plasma of the first process gas containing the first rare gas is able to form a feature having high verticality and remove a large amount of a deposit, compared to the plasma of the process gas containing the argon gas. However, the plasma of the first process gas has low selectivity with respect to the mask. On the other hand, the plasma of the rare gas having an atomic number less than the atomic number of argon, that is, the plasma of the second rare gas has low sputtering efficiency, that is, low etching efficiency. Therefore, the plasma of the second process gas containing the second rare gas has low etching efficiency for a material having a large atomic number. However, the plasma of the second process gas has excellent selectivity with respect to the mask.

The method is able to improve verticality of the feature formed by the etching in the step of exposing the workpiece to the plasma of the first process gas, and is able to reduce the deposit on the side wall surface of the feature. In addition, the method is able to improve a selection ratio of the etching of the etching target layer with respect to the mask by the step of exposing the workpiece to the plasma of the second process gas. By sequentially performing these two steps, the method is able to simultaneously satisfy the three requirements described above.

An example of the etching target layer is a PtMn layer, and an example of the mask is a mask containing Ta. In addition, the first process gas and the second process gas may further contain methane gas.

Advantageous Effects of Invention

As described above, in etching of the etching target layer formed from the material having a relatively large atomic number such as a metal, it is possible to simultaneously satisfy the high verticality of the feature, the smallness of the amount of the deposit which is deposited on the side wall surface of the feature, and the high selection ratio of the etching of the etching target layer with respect the mask.

BRIEF DESCRIPTION OF DRAWINGS

FIG. 7A, FIG. 7B, and FIG. 7C are diagrams illustrating a tendency of a type of a rare gas and a feature formed by etching.

FIG. 9A, FIG. 9B, and FIG. 9C are diagrams illustrating three graphs which show an influence of a type of a rare gas and a high frequency bias power with respect to the feature.

DESCRIPTION OF EMBODIMENTS

Figure 1:
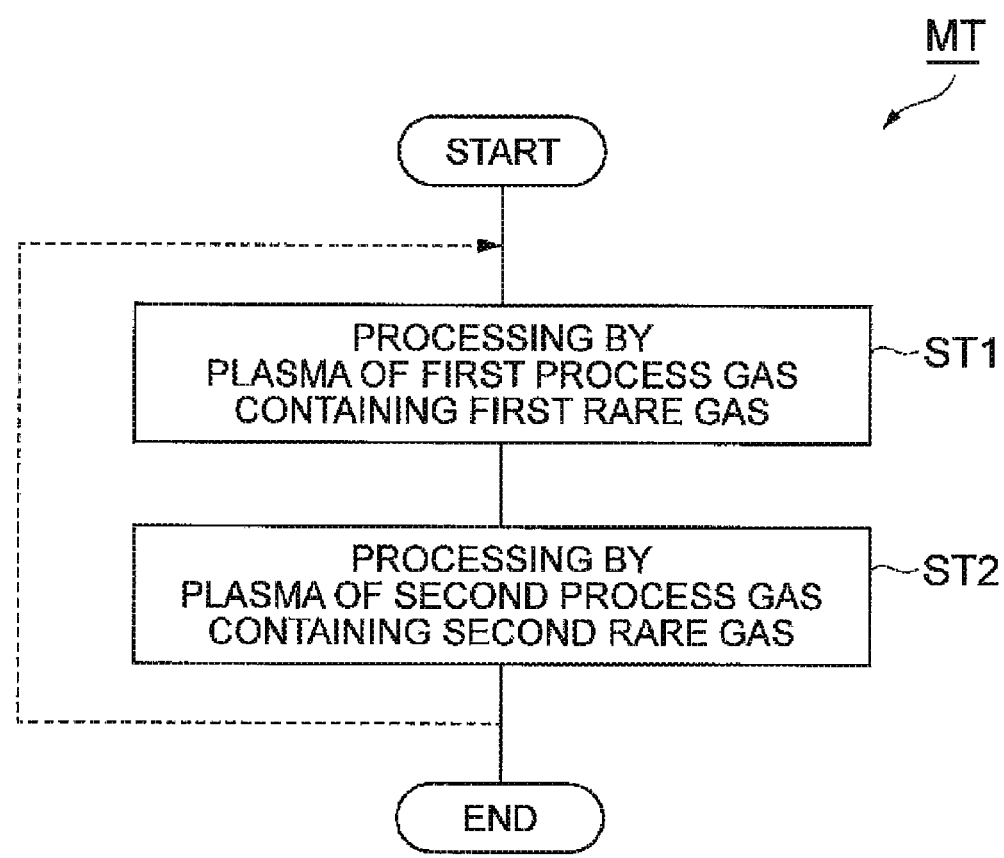
FIG. 1 is a flow chart illustrating an embodiment of a method of etching an etching target layer.

Hereinafter, various embodiments will be described in detail with reference to the drawings. In the drawings, the same reference numerals are applied to the same or equivalent portions.

FIG. 1 is a flow chart illustrating an embodiment of a method for etching an etching target layer. A method MT illustrated in FIG. 1 includes a step ST1 and a step ST2. In the step ST1, a workpiece (hereinafter, referred to as a "wafer") including an etching target layer is exposed to a plasma of a first process gas containing a first rare gas. In the step ST2, the wafer is exposed to a plasma of a second process gas containing a second rare gas. In one embodiment, alternative repetition of the step ST1 and the step ST2 may be performed.

The first rare gas contained in the first process gas is a rare gas having an atomic number which is greater than the atomic number of argon gas, and for example, is Kr gas. In addition, the second rare gas contained in the second process gas is a rare gas having an atomic number which is less than the atomic number of argon gas, and for example, is Ne gas. In addition, the first process gas and the second process gas may further contain methane gas and hydrogen gas.

The wafer, which is an application target of the method MT, includes the etching target layer, and a mask provided on the etching target layer. The etching target layer and the mask are formed from respective materials for which etching efficiency by a plasma of a rare gas having an atomic number greater than the atomic number of argon is higher than etching efficiency for the materials by a plasma of argon gas. In addition, the mask is formed from a material having a melting point higher than the melting point of the etching target layer. The etching target layer and the mask may be formed from any such material. For example, the mask may include a film formed from TiN, Ta, Ti, TaN, or W. In addition, the etching target layer may be a layer formed from PtMn, IrMn, CoPd, CoPt, Ru, Mgo, CoFeB, CoFe, or Ni.

In the method MT, the etching target layer is etched by the first process gas in the step ST1. The plasma of the rare gas having an atomic number greater than the atomic number of argon, that is, the plasma of the first rare gas has high sputtering efficiency, that is, high etching efficiency for a material having a relatively large atomic number. Therefore, the plasma of the first process gas containing the first rare gas is able to form a feature having high verticality and remove a large amount of a deposit, compared to a plasma of a process gas containing argon gas. However, the plasma of the first process gas has low selectivity with respect to the mask. In contrast, the plasma of the rare gas having an atomic number less than the atomic number of argon, that is, the plasma of the second rare gas has low sputtering efficiency, that is, low etching efficiency. Therefore, the plasma of the second process gas containing the second rare gas has low etching efficiency for a material having a large atomic number. However, the plasma of the second process gas has excellent selectivity with respect to the mask.

Figure 10:
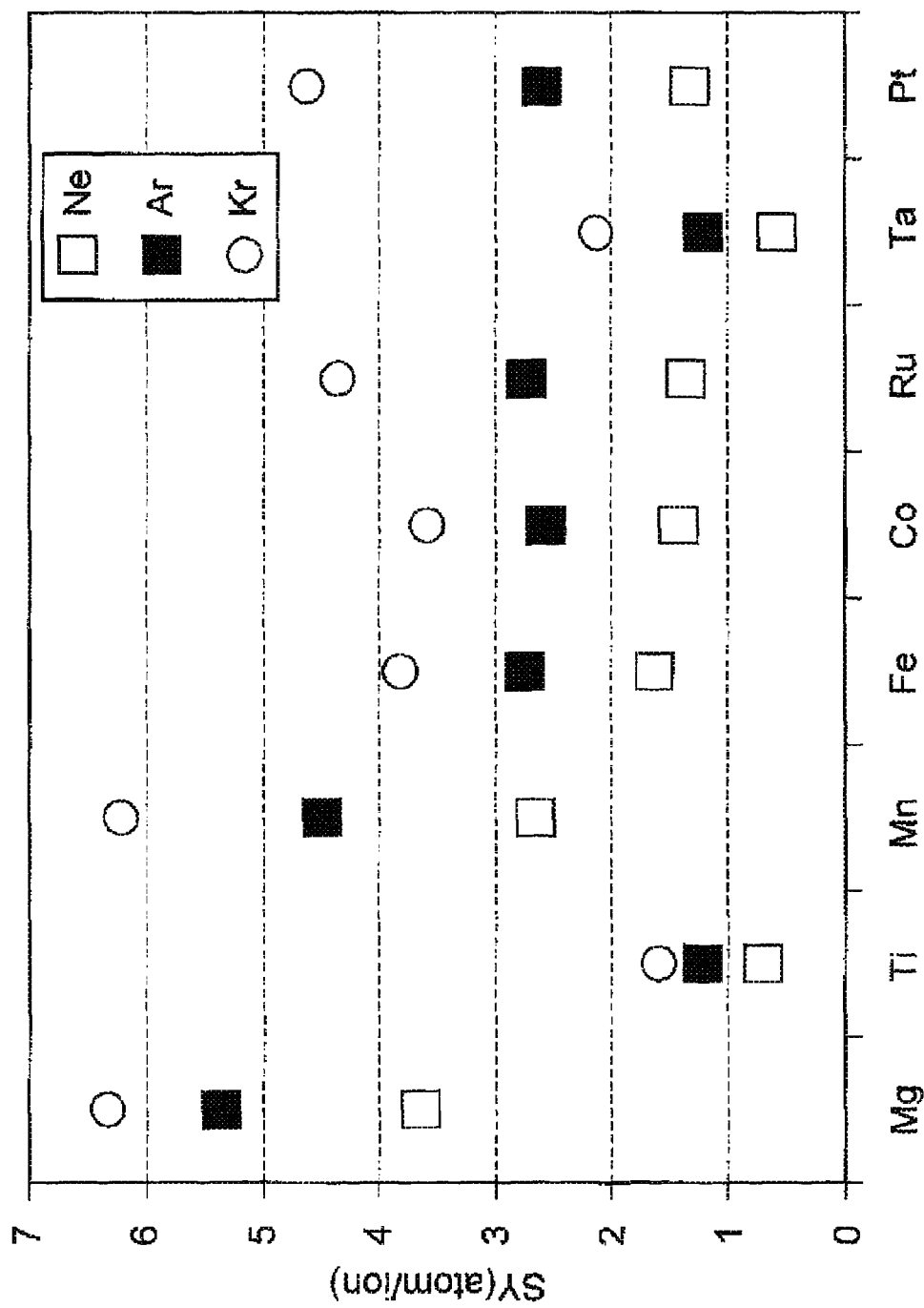
FIG. 10 is a graph illustrating a sputtering yield of each of Ne, Ar, and Kr.

FIG. 10 is a graph illustrating a sputtering yield of each of Ne, Ar, and Kr. Specifically, the graph illustrated in FIG. 10 shows a calculation result of efficiency, that is, a sputtering yield SY (atom/ion) by which each of Ne ions, Ar ions, and Kr ions having incidence energy of 3000 ev etches etching target layers formed from different metals. The sputtering yield SY is the number of metal atoms emitted from an etching target layer when one ion is incident on the etching target layer. In FIG. 10, the type of a metal atom is illustrated on a horizontal axis, and the sputtering yield SY is illustrated on a vertical axis.

As illustrated in FIG. 10, the Kr ion has a high sputtering yield SY, that is, high sputtering efficiency for a metal which may configure the etching target layer, for example, Pt, Mn, Mg, F, Co, Ru, or the like. However, the Kr ion has a sputtering yield SY of greater than or equal to 1 even for Ti or Ta which configures the mask. Therefore, the first process gas containing the first rare gas such as Kr enables a feature having high verticality to be formed in the etching target layer, and enables a large amount of the deposit to be removed. However, the first process gas has low selectivity with respect to the mask.

In contrast, the Ne ion has a sputtering yield SY which is low but greater than or equal to 1 for a metal which may configure the etching target layer, for example, Pt, Mn, Mg, F, Co, Ru, or the like. In addition, the Ne ion has a sputtering yield SY of less than 1 for Ti or Ta which may configure the mask. Therefore, the second process gas containing the second rare gas such as Ne has low etching efficiency for a metal which may configure the etching target layer, but enables the metal to be etched. In addition, the second process gas does not substantially etch the mask.

As apparent from the graph illustrated in FIG. 10, in the method MT, the step of exposing the wafer to the plasma of the first process gas is able to improve the verticality of the feature formed by etching, and reduce the amount of the deposit on the side wall surface of the feature. In addition, the step of exposing the workpiece to the plasma of the second process gas is able to improve a selection ratio of the etching of the etching target layer with respect to the mask. Therefore, according to the method MT, by sequentially performing such two steps, it is possible to simultaneously satisfy three requirements, that is, (1) the high verticality of the feature formed by the etching, (2) the smallness of the amount of the deposit on the side wall surface of the feature, and (3) the high selection ratio of the etching of the etching target layer with respect to the mask.

Figure 2:
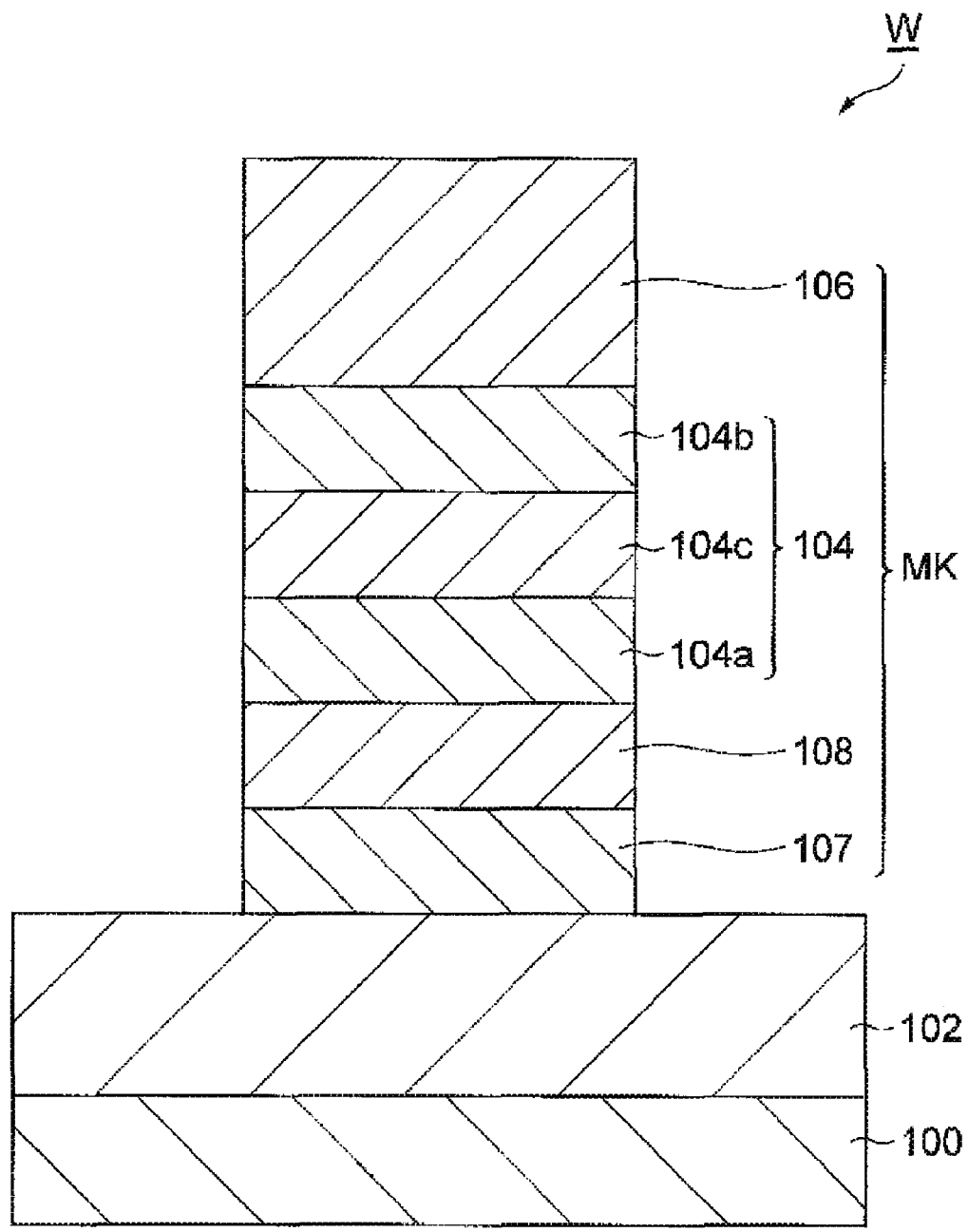
FIG. 2 is a diagram illustrating an example of a workpiece to which a method MT is applied.

FIG. 2 is a diagram illustrating an example of the workpiece to which the method MT is applied. An example of the workpiece illustrated in FIG. 2, that is, a wafer W is a product which is obtained during the manufacturing of an MRAM element having an MTJ structure. As illustrated in FIG. 2, the wafer W includes an underlying layer 100, an etching target layer 102, an MTJ structure 104, and an upper layer 106. In an example, the underlying layer 100 is a layer which will be a lower electrode and may be configured of Ta, and the thickness thereof is 3 nm. The etching target layer 102 is disposed on the underlying layer 100, and in an example, the etching target layer 102 is a layer which will be a pinning layer and is formed from PtMn, and the thickness thereof is 20 nm. In addition, the upper layer 106 is disposed on the etching target layer 102, and in an example, the upper layer 106 contains Ta. The thickness of the upper layer 106, for example, is 50 nm. The MTJ structure 104 is disposed between the etching target layer 102 and the upper layer 106, and is configured with multilayered films containing a metal such as a ferromagnetic material. The MTJ structure 104, for example, is configured to have an insulating layer 104c between a first magnetic layer 104a and a second magnetic layer 104b. The first magnetic layer 104a and the second magnetic layer 104b, for example, are formed from CoFeB, and the thickness of each of the first magnetic layer 104a and the second magnetic layer 104b is 2.5 nm. The insulating layer 104c, for example, is a metal oxide layer such as an MgO layer, an aluminum oxide layer, a titanium oxide layer, or the like, and the thickness thereof is 1.2 nm. In addition, the wafer W may further include a magnetic layer 107 and a magnetic layer 108. The magnetic layer 107 is disposed on the etching target layer 102, and for example, may be formed from CoFe. The magnetic layer 108 is disposed between the magnetic layer 107 and the MTJ structure 104, and for example, is formed from Ru, and the thickness thereof is 0.8 nm. The etching target layer 102 of the wafer W is an example of an etching target of the method MT, and in one application example of the method MT, the etching target layer 102 is etched with a multilayer structure comprised of the upper layer 106, the MTJ structure 104, the magnetic layer 107, and the magnetic layer 108 serving as a mask MK.

Figure 3:
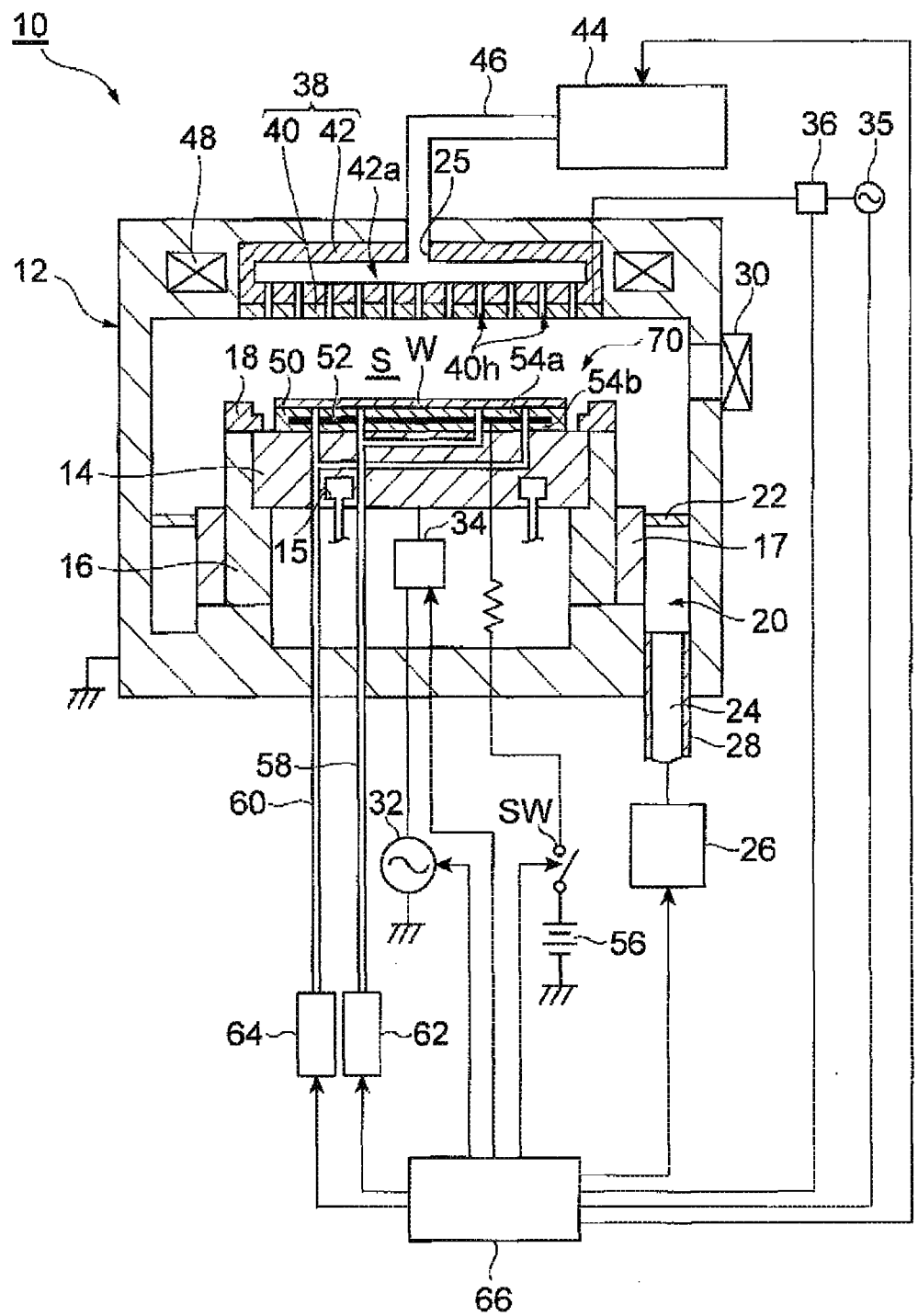
FIG. 3 is a diagram illustrating an example of a plasma processing apparatus.

Hereinafter, a plasma processing apparatus which may be used for performing the method MT will be described. FIG. 3 is a diagram illustrating an example of a plasma processing apparatus. A plasma processing apparatus 10 illustrated in FIG. 3 is a capacitive coupling plasma processing apparatus. It should be noted that any plasma processing apparatus, such as an inductive coupling plasma processing apparatus or a plasma processing apparatus using a surface wave such as a microwave, may be used for performing the method MT.

As illustrated in FIG. 3, the plasma processing apparatus 10 includes a processing vessel 12. The processing vessel 12 has a substantially cylindrical shape, and defines a processing space S as an inner space thereof. The plasma processing apparatus 10 includes a base 14, which has a substantially disk shape, in the processing vessel 12. The base 14 is disposed below the processing space S. The base 14, for example, is formed of aluminum and configures the lower electrode. The base 14 has a function of absorbing the heat of an electrostatic chuck 50 described below and cooling the electrostatic chuck 50 in a process.

A coolant flow passage 15 is formed in the base 14, and a coolant inlet pipe and a coolant outlet pipe are connected to the coolant flow passage 15. In the plasma processing apparatus 10, a suitable coolant, for example, cooling water or the like is circulated in the coolant flow passage 15. Accordingly, the temperature of the base 14 and the electrostatic chuck 50 are controlled to a predetermined temperature.

In addition, the plasma processing apparatus 10 further includes a cylindrical holding part 16 and a cylindrical supporting part 17. The cylindrical holding part 16 is in contact with the side surface and an edge portion of the bottom surface of the base 14 to hold the base 14. The cylindrical supporting part 17 extends to a vertical direction from a bottom portion of the processing vessel 12, and supports the base 14 through the cylindrical holding part 16. The plasma processing apparatus 10 further includes a focus ring 18 which is disposed on the upper surface of the cylindrical holding part 16. The focus ring 18 may be formed from, for example, silicon or quartz.

In one embodiment, an exhaust passage 20 is formed between the side wall of the processing vessel 12 and the cylindrical supporting part 17. A baffle plate 22 is attached to an inlet of the exhaust passage 20 or at the middle thereof. In addition, an exhaust port 24 is provided in a bottom portion of the exhaust passage 20. The exhaust port 24 is defined by an exhaust pipe 28 which is fitted into the bottom portion of the processing vessel 12. An exhaust device 26 is connected to the exhaust pipe 28. The exhaust device 26 includes a vacuum pump, and is able to depressurize the processing space S in the processing vessel 12 to a predetermined degree of vacuum. A gate valve 30, which opens and closes an opening for transferring the wafer W, is attached to the side wall of the processing vessel 12.

A high frequency power source 32 for drawing ions is electrically connected to the base 14 through a matcher 34. The high frequency power source 32 applies high frequency bias power having a frequency suitable for drawing ions, for example, 400 KHz, to the lower electrode, that is, the base 14.

The plasma processing apparatus 10 further includes a shower head 38. The shower head 38 is disposed above the processing space S. The shower head 38 includes an electrode plate 40 and an electrode support 42.

The electrode plate 40 is a conductive plate having a substantially disk shape, and configures an upper electrode. A high frequency power source 35 for generating plasma is electrically connected to the electrode plate 40 through a matcher 36. The high frequency power source 35 supplies high frequency power having a frequency for generating plasma, for example, 60 MHz, to the electrode plate 40. When the high frequency power is applied to the electrode plate 40 by the high frequency power source 35, high frequency electric field is formed in a space between the base 14 and the electrode plate 40, that is, the processing space S.

A plurality of gas flow holes 40h are formed in the electrode plate 40. The electrode plate 40 is detachably supported by the electrode support 42. A buffer chamber 42a is formed in the electrode support 42. The plasma processing apparatus 10 further includes a gas supply part 44, and the gas supply part 44 is connected to a gas introduction port 25 of the buffer chamber 42a through a gas supply conduit 46. The gas supply part 44 supplies a process gas to the processing space S. The gas supply part 44 is capable of supplying a plurality of types of gas. In one embodiment, the gas supply part 44 is capable of supplying methane gas, the first rare gas, the second rare gas, and hydrogen gas.

A plurality of holes, which are continued to the respective gas flow holes 40h, are formed in the electrode support 42, and the plurality of holes are communicated with the buffer chamber 42a. Therefore, gas supplied from the gas supply part 44 is supplied to the processing space S through the buffer chamber 42a and the gas flow holes 40h.

In addition, a magnetic field formation mechanism 48, which circularly or coaxially extends, is provided in a ceiling portion of the processing vessel 12 of the plasma processing apparatus 10. The magnetic field formation mechanism 48 functions such that high frequency discharge in the processing space S easily starts (plasma ignition), and the discharge is stably maintained.

In addition, the electrostatic chuck 50 is disposed on the upper surface of the base 14. The electrostatic chuck 50 includes an electrode 52, and a pair of insulating films 54a and 54b. The insulating films 54a and 54b are films which are formed of an insulator such as ceramic. The electrode 52 is a conductive film, and is disposed between the insulating film 54a and the insulating film 54b. A direct current power source 56 is connected to the electrode 52 through a switch SW. When a direct current voltage is applied to the electrode 52 from the direct current power source 56, a coulomb force is generated, and the wafer W is attracted to and held on the electrostatic chuck 50 by the coulomb force. In addition, a heater, which is a heating element, is embedded in the electrostatic chuck 50 to heat the wafer W to a predetermined temperature. The heater is connected to a heater power source through wiring.

The plasma processing apparatus 10 further includes gas supply lines 58 and 60, and heat transfer gas supply parts 62 and 64. The heat transfer gas supply part 62 is connected to the gas supply line 58. The gas supply line 58 extends to the upper surface of the electrostatic chuck 50, and circularly extends in the center portion of the upper surface. The heat transfer gas supply part 62 supplies heat transfer gas such as He gas between the upper surface of the electrostatic chuck 50 and the wafer W. In addition, the heat transfer gas supply part 64 is connected to the gas supply line 60. The gas supply line 60 extends to the upper surface of the electrostatic chuck 50, and circularly extends in the upper surface such that the gas supply line 60 surrounds the gas supply line 58. The heat transfer gas supply part 64 supplies heat transfer gas such as He gas between the upper surface of the electrostatic chuck 50 and the wafer W.

In addition, the plasma processing apparatus 10 further includes a controller 66. The controller 66 is connected to the exhaust device 26, the switch SW, the high frequency power source 32, the matcher 34, the high frequency power source 35, the matcher 36, the gas supply part 44, and the heat transfer gas supply parts 62 and 64. The controller 66 transmits control signals to the exhaust device 26, the switch SW, the high frequency power source 32, the matcher 34, the high frequency power source 35, the matcher 36, the gas supply part 44, and the heat transfer gas supply parts 62 and 64, respectively. The exhaustion of the exhaust device 26, the opening and closing of the switch SW, the supply of the high frequency bias power from the high frequency power source 32, the impedance adjustment of the matcher 34, the supply of the high frequency power from the high frequency power source 35, the impedance adjustment of the matcher 36, the supply of the process gas from the gas supply part 44, and the supply of the heat transfer gas from each of the heat transfer gas supply parts 62 and 64 are controlled by the control signals from the controller 66.

The plasma processing apparatus 10 is capable of selectively supplying the first process gas and the second process gas to the processing space S from the gas supply part 44. When a high frequency electric field is formed between the electrode plate 40 and the base 14, that is, in the processing space S, in a state where the process gas such as the first process gas and the second process gas is supplied to the processing space S, a plasma is generated in the processing space S. The etching target layer of the wafer W is etched by active species of elements contained in the process gas.

Hereinafter, effectiveness of the method MT will be described by showing various data items. The following data items were obtained by etching the wafer W illustrated in FIG. 2 using the plasma processing apparatus 10. The etching target layer 102 was a PtMn layer having a thickness of 20 nm. In addition, the upper layer 106 was a Ta layer, and the total thickness of the upper layer 106 and the MTJ structure 104 was approximately 50 nm.

[Etching Efficiency depending on Type of Rare Gas]

Figure 4:
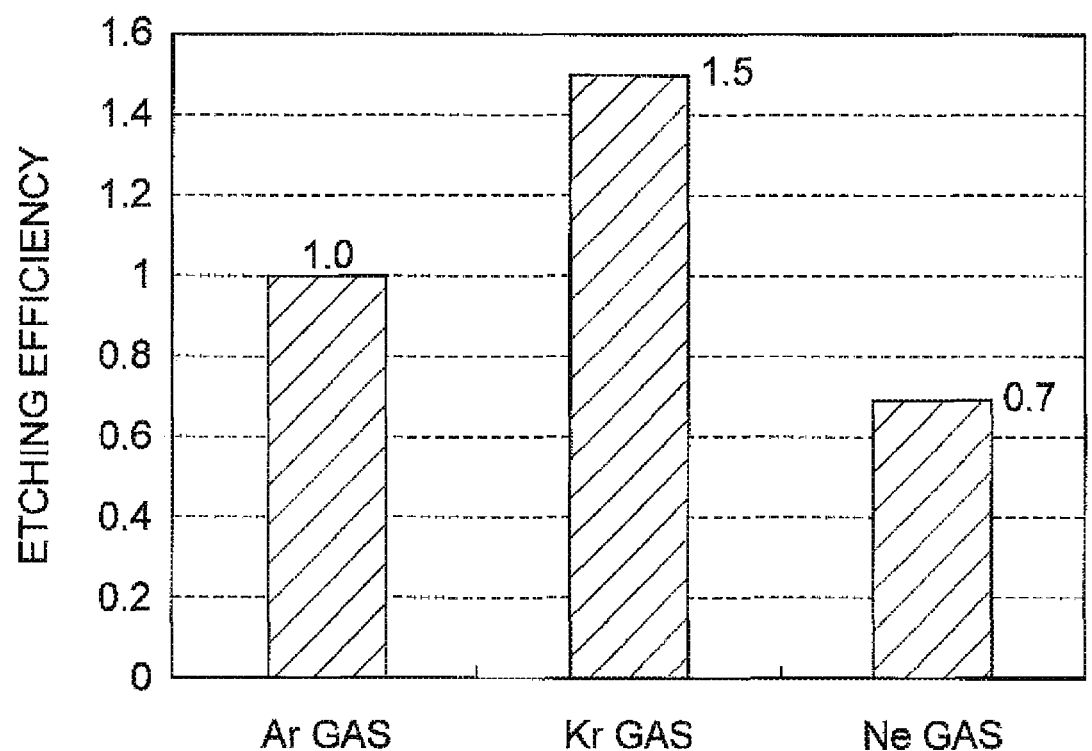
FIG. 4 is a graph illustrating etching efficiency of the etching target layer according to a type of a rare gas.

Reference is made to FIG. 4. FIG. 4 is a graph illustrating etching efficiency of the etching target layer depending on a type of a rare gas. The etching efficiency of FIG. 4 was obtained by varying the rare gas in the process gas. Specifically, three types of gases, that is, argon (Ar) gas, Kr gas, and Ne gas were used as the rare gas. Other conditions at the time of obtaining the etching efficiency of FIG. 4 are as follows.

<Conditions>

Pressure in Processing vessel 12: 10 mTorr (1.333 Pa)
High Frequency Power for Generating Plasma: 800 W
High Frequency Bias Power: 1500 W
Flow Rate of Hydrogen Gas in Process gas: 300 sccm
Flow Rate of Methane Gas in Process gas: 90 sccm
Flow Rate of Rare Gas in Process gas: 50 sccm
Wafer Temperature: −20° C.

In FIG. 4, the type of a rare gas in the process gas is illustrated on a horizontal axis, and etching efficiency is illustrated on a vertical axis. The etching efficiency is an etching rate with a process gas containing another rare gas in a case where an etching rate with a process gas containing Ar gas is set to "1". Referring to FIG. 4, it is confirmed that in comparison with the process gas containing the Ar gas, the process gas containing the Kr gas has high etching efficiency for the etching target layer 102, whereas the etching gas containing the Ne gas has low etching efficiency for the etching target layer 102.

[Influence of Type of Rare Gas and Etching Time with Respect to Feature]

Figure 5A:
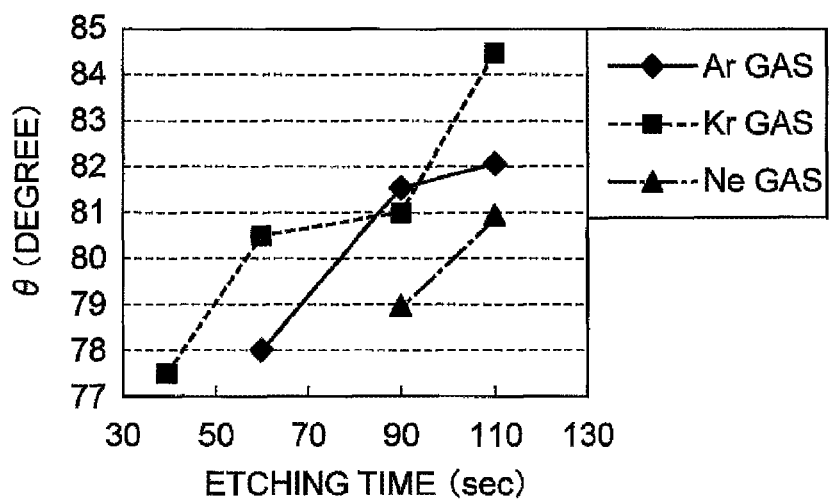
FIG. 5A, FIG. 5B, and FIG. 5C are diagrams illustrating three graphs which show an influence of a type of a rare gas and an etching time with respect to a feature.
Figure 5B:
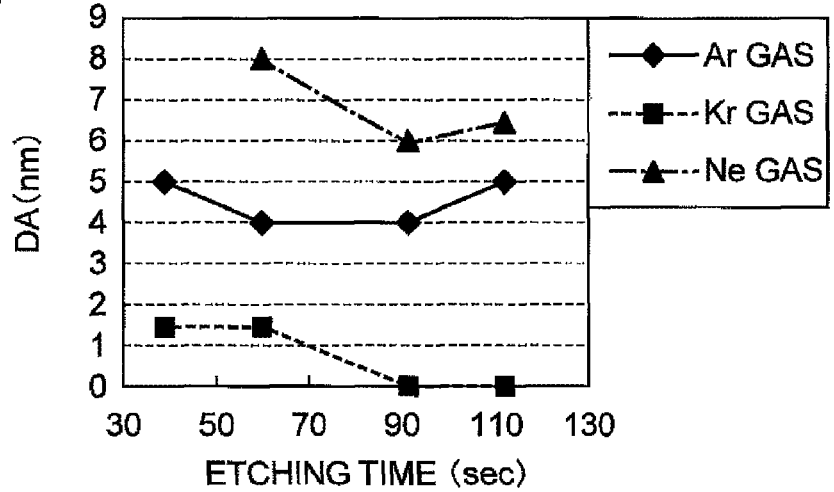
Figure 5C:
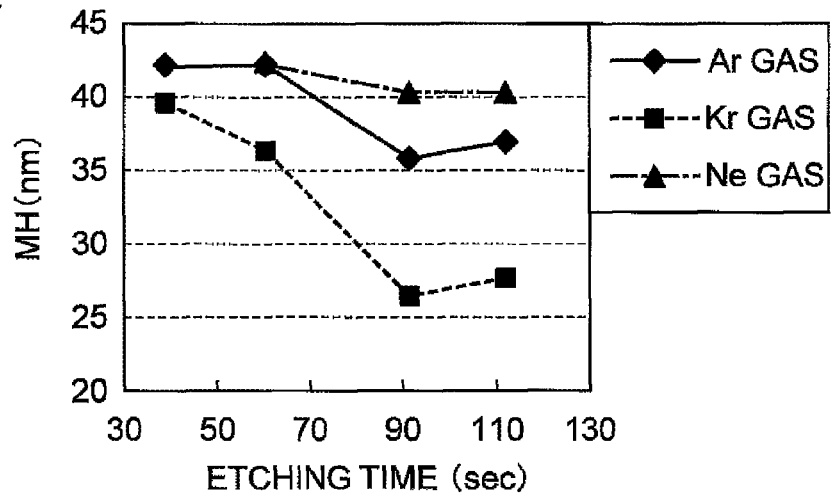
Figure 6:
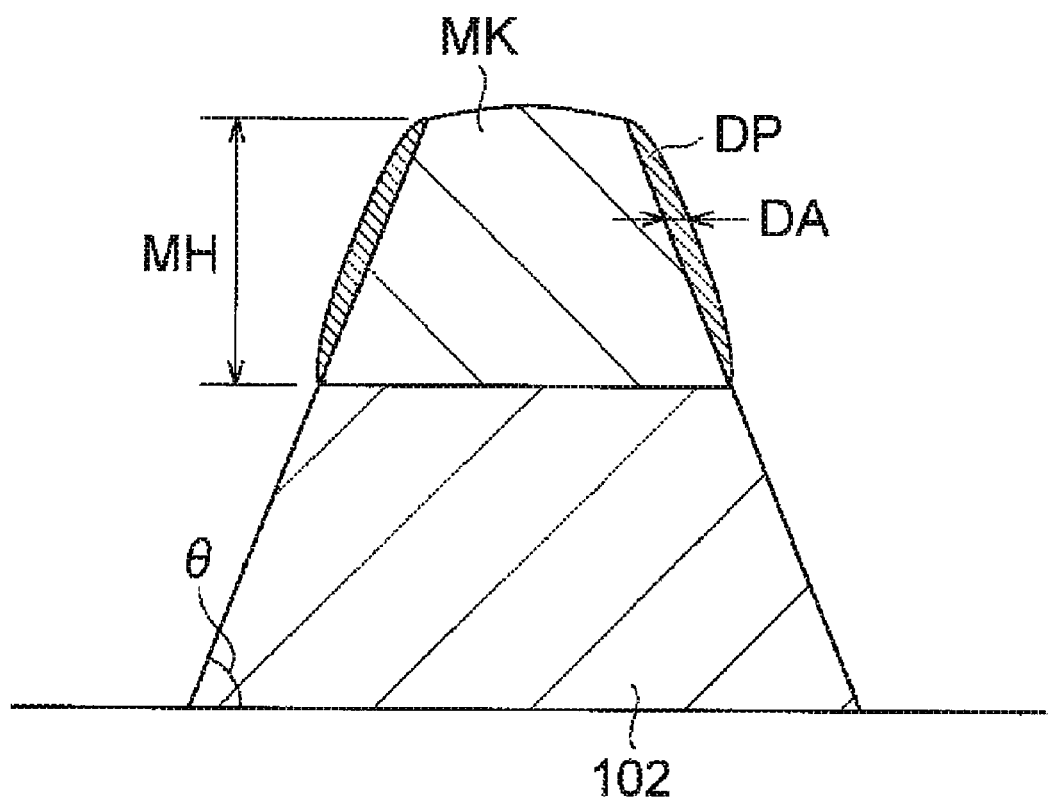
FIG. 6 is a diagram illustrating parameters of the feature.

Reference is made to FIG. 5A, FIG. 5B, and FIG. 5C. FIG. 5A, FIG. 5B, and FIG. 5C are diagrams illustrating three graphs which show an influence of a type of a rare gas and an etching time with respect to the feature. Data shown in FIG. 5A, FIG. 5B, and FIG. 5C indicates etching time dependency of the feature obtained by etching the etching target layer 102 in the same conditions as those for obtaining the data of FIG. 4. Specifically, in FIG. 5A, a relationship between an etching time (a horizontal axis) and an angle θ (a vertical axis) is illustrated. In addition, in FIG. 5B, a relationship between an etching time (a horizontal axis) and a thickness DA of a deposit (a vertical axis) is illustrated. Further, in FIG. 5C, a relationship between an etching time (a horizontal axis) and a thickness MH of the mask MK after being etched is illustrated. As illustrated in FIG. 6, the angle θ is an angle between the side wall surface of the etching target layer 102 after being etched and the undercoat layer. In addition, the thickness DA of the deposit is the thickness in a horizontal direction of the deposit DP remaining along the side wall surface of the mask MK after being etched. Further, the thickness MH is the thickness in a film thickness direction of the mask MK remaining after being etched. In FIG. 5A, FIG. 5B, and FIG. 5C, the legend of "Ar gas" indicates data in a case of using the process gas containing Ar gas, the legend of "Kr gas" indicates data in a case of using the process gas containing Kr gas, and the legend of "Ne gas" indicates data in a case of using the process gas containing Ar gas.

In the experiment for obtaining the data of FIG. 5A, FIG. 5B, and FIG. 5C, an undercoat layer was exposed at an etching time of 60 seconds, an etching time of 40 seconds, and an etching time of 90 seconds in a case of using the process gas containing the Ar gas, a case of using the process gas containing the Kr gas, and a case of using the process gas containing the Ne gas, respectively. Therefore, etching over 60 seconds, etching over 40 seconds, and etching over 90 seconds are over-etching in a case of using the process gas containing the Ar gas, a case of using the process gas containing the Kr gas, and a case of using the process gas containing the Ne gas, respectively.

Referring to FIG. 5A, it is confirmed that there is a limit to improve the angle θ even when either the process gas containing the Ne gas or the process gas containing the Ar gas is used, whereas there is a tendency for the angle θ to be close to 90 degrees in proportion to the length of the etching time in a case where the process gas containing the Kr gas is used. Therefore, it is confirmed that the verticality of the feature formed by the etching is enhanced by using the process gas containing the Kr gas as the rare gas. In addition, it is confirmed that by using the process gas containing the Kr gas, it is possible to obtain an angle, that is, the verticality which is not able to be obtained by the process gas containing the Ar gas.

Referring to FIG. 5B, it is confirmed that the thickness DA of the deposit DP is large even when either the process gas containing the Ne gas or the process gas containing the Ar gas is used, whereas there is a tendency for the thickness DA of the deposit DP to decrease in proportion to the length of the etching time in a case where the process gas containing the Kr gas is used. Therefore, it is confirmed that it is possible to reduce the amount of the deposit by using the process gas containing the Kr gas as the rare gas.

Referring to FIG. 5C, it is confirmed that the thickness MH of the mask MK becomes small in a case where the process gas containing the Kr gas is used, whereas the thickness MH of the mask MK becomes large in a case where the process gas containing the Ne gas is used. Therefore, it is confirmed that in a case where the process gas containing the Ne gas is used, it is possible to maintain the film thickness of the mask MK, that is, it is possible to enhance selectivity of the etching target layer 102 with respect to the mask MK.

The tendency confirmed from the data of FIG. 4, FIG. 5A, FIG. 5B, and FIG. 5C will be described with reference to FIG. 7A, FIG. 7B, and FIG. 7C. FIG. 7A illustrates a sectional view of the state of the wafer after being etched in a case of using the process gas containing the Ar gas, FIG. 7B illustrates a sectional view of the state of the wafer after being etched in a case of using the process gas containing the Ne gas, and FIG. 7C illustrates a sectional view of the state of the wafer after being etched in a case of using the process gas containing the Kr gas.

In comparison with the tendency (see FIG. 7A) of the case using the process gas containing the Ar gas, it is possible to enhance the verticality of the side wall of the etching target layer 102 and to reduce the amount of the deposit DP by using the process gas containing the Kr gas, as illustrated in FIG. 7C. However, in a case where the process gas containing the Kr gas is used, the film thickness of the mask MK decreases, and the shoulder of the mask MK is largely removed. In addition, in comparison with the tendency of the case using the process gas containing the Ar gas, using the process gas containing the Ne gas causes the verticality of the side wall of the etching target layer 102 to deteriorate and the amount of the deposit DP to increase, but enables the film thickness of the mask MK to be maintained, as illustrated in FIG. 7B. That is, it is possible to increase the selectivity of the etching target layer 102 with respect to the mask MK by using the process gas containing the Ne gas.

[Influence of Type of Rare Gas and Flow Rate of Methane Gas with Respect to Feature]

Figure 8A:
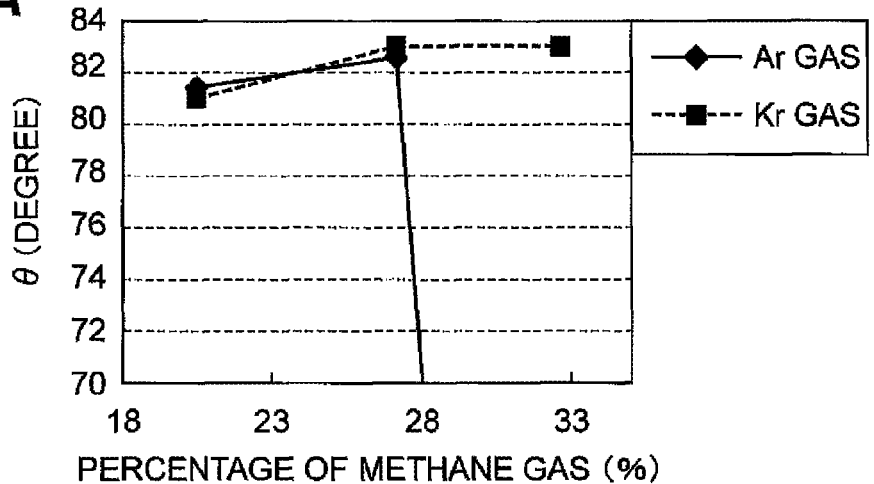
FIG. 8A, FIG. 8B, and FIG. 8C are diagrams illustrating three graphs which show an influence of a type of a rare gas and a flow rate of methane gas with respect to the feature.
Figure 8B:
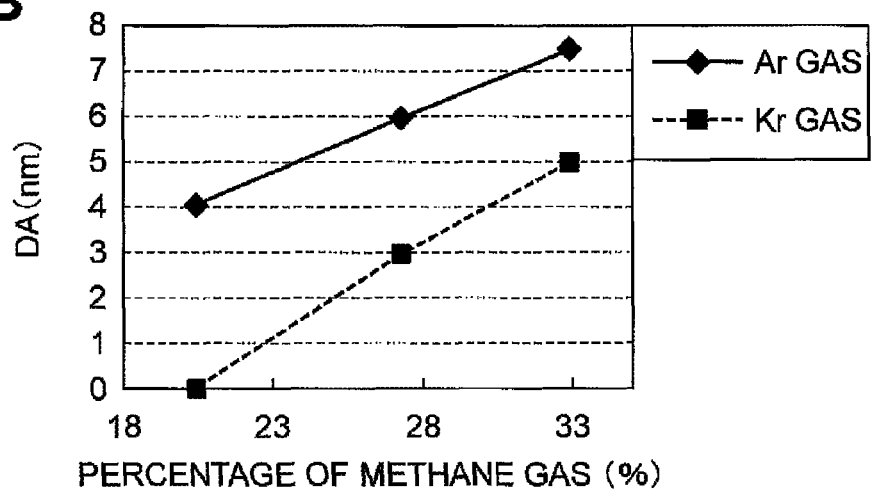
Figure 8C:
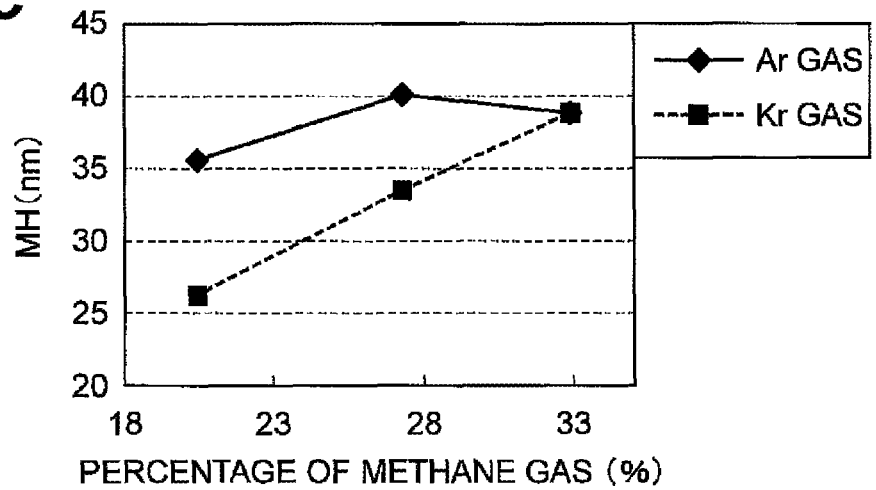

Reference is made to FIG. 8A, FIG. 8B, and FIG. 8C. FIG. 8A, FIG. 8B, and FIG. 8C are diagrams illustrating three graphs which show an influence of a type of a rare gas and a flow rate of methane gas with respect to the feature. Data shown in FIG. 8A, FIG. 8B, and FIG. 8C was obtained by changing the flow rate of the methane gas in the process gas on the basis of the conditions for obtaining the data of FIG. 4. Specifically, in FIG. 8A, a relationship between a percentage of the flow rate of the methane gas in the process gas (a horizontal axis) and the angle θ (a vertical axis) is illustrated. In addition, in FIG. 8B, a relationship between a percentage of the flow rate of the methane gas in the process gas (a horizontal axis) and the thickness DA of the deposit (a vertical axis) is illustrated. In addition, in FIG. 8C, a relationship between a percentage of the flow rate of the methane gas in the process gas (a horizontal axis) and the thickness MH of the mask MK after being etched is illustrated. In FIG. 8A, FIG. 8B, and FIG. 8C, a legend of "Ar gas" indicates data in a case of using the process gas containing the Ar gas, and a legend of "Kr gas" indicates data in a case of using the process gas containing the Kr gas.

Referring to FIG. 8A, it is confirmed that in a case where the process gas containing the Ar gas is used, the verticality considerably deteriorates when the flow rate of the methane gas increases. In contrast, it is confirmed that the verticality is enhanced in proportion to the flow rate of the methane gas in a case where the process gas containing the Kr gas is used. Referring to FIG. 8B, it is confirmed that in a case where the process gas containing the Kr gas is used, the amount of the deposit decreases even when the flow rate of the methane gas increases, in comparison with a case where the process gas containing the Ar gas is used. Referring to FIG. 8C, it is confirmed that in a case where the process gas containing the Kr gas is used, increasing the flow rate of the methane gas enables the thickness of the mask MK after being etched to be maintained to the same level as that in a case where the process gas containing the Ar gas is used. Therefore, it is confirmed that according to the process gas containing the Kr gas, it is possible to improve the verticality, to reduce the amount of the deposit, and to obtain the same selectivity as that in a case where the process gas containing the Ar gas, by adjusting the amount of methane gas.

[Influence of Type of Rare Gas and High Frequency Bias Power with Respect to Feature]

Reference is made to FIG. 9A, FIG. 9B, and FIG. 9C. FIG. 9A, FIG. 9B, and FIG. 9C are diagrams illustrating three graphs which show an influence of a type of a rare gas and high frequency bias power with respect to the feature. Data shown in FIG. 9A, FIG. 9B, and FIG. 9C was obtained by changing the high frequency bias power on the basis of the conditions for obtaining the data of FIG. 4. In FIG. 9A, a relationship between the etching time (a horizontal axis) and the angle θ (a vertical axis) is illustrated. In addition, in FIG. 9B, a relationship between the etching time (a horizontal axis) and the thickness DA of the deposit (a vertical axis) is illustrated. In addition, in FIG. 9C, a relationship between the etching time (a horizontal axis) and the thickness MH of the mask MK after being etched is illustrated. In FIG. 9A, FIG. 9B, and FIG. 9C, a legend of "Ar (1500 W)" indicates data in a case where the process gas containing the Ar gas was used and high frequency bias power of 1500 W was supplied, a legend of "Kr (1500 W)" indicates data in a case where the process gas containing the Kr gas was used and high frequency bias power of 1500 W was supplied, and a legend of "Kr (1000 W)" indicates data in a case where the process gas containing the Kr gas was used and high frequency bias power of 1000 W was supplied.

Referring to FIG. 9A, it is confirmed that in a case where the process gas containing the Kr gas is used, it is possible to increase the angle θ, that is, it is possible to improve the verticality, by increasing the high frequency bias power. In addition, it is confirmed that in comparison with a case where the process gas containing the Ar gas is used, it is possible to obtain high verticality by using the process gas containing the Kr gas even with the same high frequency bias power. Further, it is confirmed that even when low high frequency bias power (1000 W) is used, using the process gas containing the Kr gas makes it possible to obtain the same verticality as that in a case where the process gas containing the Ar gas is used and high frequency bias power (1500 W) is used.

Referring to FIG. 9B, it is confirmed that even when the high frequency bias power is low, it is possible to reduce the amount of the deposit by using the process gas containing the Kr gas, compared to a case where the process gas containing the Ar gas is used. Referring to FIG. 9C, it is confirmed that even when the process gas containing the Kr gas is used, decreasing the high frequency bias power (1000 W) makes it possible to maintain the film thickness of the mask MK to the same level as that in a case where the process gas containing the Ar gas is used. That is, it is confirmed that even when the process gas containing the Kr gas is used, it is possible to realize the same selectivity as that in a case where the process gas containing the Ar gas is used.

To sum up the confirmed matters from the data items described above, it is possible to improve the verticality and reduce the amount of the deposit by using the first process gas containing the first rare gas such as Kr gas, compared to the process gas containing the Ar gas. In addition, by using the first process gas containing the first rare gas, it is possible to maintain the film thickness of the mask MK, that is, it is possible to obtain the selectivity to the same level as that in a case where the process gas containing the Ar gas is used. In addition, it is possible to improve the selectivity by using the second process gas containing the second rare gas such as Ne gas, compared to a case where the process gas containing the Kr gas or the Ar gas is used. Therefore, sequentially performing the step ST1 and the step ST2 are able to satisfy three requirements, that is, the improvement of the verticality, the smallness of the amount of the deposit, and the improvement of the selectivity.

[Experimental Example]

Hereinafter, an experimental example in which the method MT was performed will be described. In the experimental example, the method MT was applied to the same wafer as that at the time of obtaining the data of FIG. 4, by using the plasma processing apparatus 10. In addition, as a first reference example, the etching target layer 102 of the same wafer was etched by only using the process gas containing the Ar gas. Further, as a second reference example, the etching target layer 102 of the same wafer was etched by only using the process gas containing the Kr gas. Hereinafter, conditions of the experimental example, the first reference example, and the second reference example will be described.

<Conditions of Experimental Example>
Pressure in Processing vessel 12: 10 mTorr (1.333 Pa)
High Frequency Power for Generating Plasma: 800 W
High Frequency Bias Power: 1500 W
Flow Rate of Hydrogen Gas in First Process gas and Second Process gas: 300 sccm
Flow Rate of Methane Gas in First Process gas and Second Process gas: 90 sccm
Flow Rate of Rare Gas in First Process gas and Second Process gas: 50 sccm
First Rare Gas: Kr
Second Rare Gas: Ne
Wafer Temperature: −20° C.
Time of Step ST1: 10 seconds
Time of Step ST2: 10 seconds
Number of Repetitions of Sequence Including Step ST1 and Step ST2: 5 times <Conditions of First Reference Example>
Pressure in Processing vessel 12: 10 mTorr (1.333 Pa)
High Frequency Power for Generating Plasma: 800 W
High Frequency Bias Power: 1500 W
Flow Rate of Hydrogen Gas in Process gas: 300 sccm
Flow Rate of Methane Gas in Process gas: 90 sccm
Flow Rate of Ar Gas in Process gas: 50 sccm
Wafer Temperature: −20° C.
Etching Time: 130 seconds <Conditions of Second Reference Example>
Pressure in Processing vessel 12: 10 mTorr (1.333 Pa)
High Frequency Power for Generating Plasma: 800 W
High Frequency Bias Power: 1500 W
Flow Rate of Hydrogen Gas in Process gas: 300 sccm
Flow Rate of Methane Gas in Process gas: 90 sccm
Flow Rate of Kr Gas in Process gas: 50 sccm
Wafer Temperature: −20° C.
Etching Time: 130 seconds Hereinafter, in each of the experimental example, the first reference example, and the second reference example, the angle θ after being etched, the thickness DA of the deposit DP, and the thickness MH of the mask MK after being etched will be described.

<Test Example>
θ: 83 degrees
DA: 1.5 nm
MH: 35.1 nm

<First Reference Example>
θ: 81.5 degrees
DA: 4.0 nm
MH: 36.0 nm

<Second Reference Example>
θ: 84 degrees
DA: 0 nm
MH: 24.2 nm

As it is apparent by comparing the angles θ after being etched, the thicknesses DA of the deposit, and the thicknesses MH of the mask MK after being etched of the experimental example, the first reference example, and the second reference example to each other, it is confirmed that according to the method MT, it is possible to realize verticality having a level which is not able to be obtained in a case where only the process gas containing the Ar gas is used (the first reference example), and it is possible to reduce the amount of deposit. In addition, it is confirmed that according to the method MT, it is possible to maintain the mask MK to have a thickness greater than that in a case where only the process gas containing the Kr gas is used (the second reference example) and to have the same thickness as that in a case where only the process gas containing the Ar gas is used (the first reference example), that is, it is possible to obtain the same selectivity as that in a case where only the process gas containing the Ar gas is used.

As described above, various embodiments have been described, but various modifications may be made without being limited to the embodiment described above. For example, the first process gas and the second process gas has been described to contain the methane gas and the hydrogen gas, but the first process gas and the second process gas may contain any gas insofar as the first process gas and the second process gas contain the first rare gas and the second rare gas, respectively, and contain carbon and hydrogen In addition, in the embodiments described above, a layer formed from PtMn is exemplified as the etching target layer 102, but the etching target layer serving as the etching target of the method MT may be another layer which is able to be etched by using the upper layer 106 as a mask, for example, a layer included in the MTJ structure 104, the magnetic layer 107, and/or the magnetic layer 108.

REFERENCE SIGNS LIST

- 10: plasma processing apparatus
- 12: processing vessel
- 32: high frequency power source (for supplying high frequency bias power)
- W: wafer
- 100: underlying layer
- 102: etching target layer
- 104: MTJ structure
- 106: upper layer
- MK: mask
- DP: deposit
- MT: method
- ST1: step
- ST2: step

The invention claimed is:

1. A method for etching an etching target layer of a workpiece, wherein
   the workpiece includes a mask on the etching target layer,
   the etching target layer is formed from PtMn, IrMn, CoPd, CoPt, Ru, MgO, CoFeB, CoFe, or Ni, and
   the mask is formed from TiN, Ta, Ti, TaN, or W,
   the method comprising:
      exposing the workpiece to a plasma of a first process gas containing a first rare gas having an atomic number greater than an atomic number of argon to etch the etching target layer by sputtering ions of the first rare gas to the etching target layer; and
      exposing the workpiece to a plasma of a second process gas containing a second rare gas having an atomic number less than the atomic number of argon to etch the etching target layer by sputtering ions of the second rare gas to the etching target layer,
      wherein said exposing the workpiece to the plasma of the first process gas and said exposing the workpiece to the plasma of the second process gas are alternately repeated.

2. The method according to claim 1,
   wherein the etching target layer contains PtMn, and the mask contains Ta.

3. The method according to claim 1,
   wherein the first process gas and the second process gas further contain methane gas.

4. The method according to claim 1,
   wherein the first rare gas is Kr gas, and the second rare gas is Ne gas.

* * * * *